(12) United States Patent
Schulz

(10) Patent No.: US 10,684,142 B2
(45) Date of Patent: *Jun. 16, 2020

(54) EVALUATION CIRCUIT FOR A CAPACITIVE SENSOR, CAPACITIVE SENSOR, AND ACTUATOR IN A MOTOR VEHICLE

(71) Applicant: IFM ELECTRONIC GMBH, Essen (DE)

(72) Inventor: Jörg Schulz, Tettnang (DE)

(73) Assignee: IFM ELECTRONIC GMBH, Essen (DE)

( * ) Notice: Subject to any disclaimer, the term of this patent is extended or adjusted under 35 U.S.C. 154(b) by 110 days.

This patent is subject to a terminal disclaimer.

(21) Appl. No.: 16/060,663

(22) PCT Filed: Sep. 14, 2016

(86) PCT No.: PCT/EP2016/071610
§ 371 (c)(1),
(2) Date: Jun. 8, 2018

(87) PCT Pub. No.: WO2018/033223
PCT Pub. Date: Feb. 22, 2018

(65) Prior Publication Data
US 2018/0274950 A1    Sep. 27, 2018

(30) Foreign Application Priority Data
Aug. 19, 2016    (DE) .......................... 10 2016 215 570

(51) Int. Cl.
*G06F 3/044*    (2006.01)
*H03K 17/96*    (2006.01)
(Continued)

(52) U.S. Cl.
CPC .......... *G01D 5/24* (2013.01); *G01R 27/2605* (2013.01); *H03K 17/955* (2013.01);
(Continued)

(58) Field of Classification Search
CPC ................... G01D 5/24; H03K 17/955; H03K 2217/960745; G01R 27/2605
See application file for complete search history.

(56) References Cited

U.S. PATENT DOCUMENTS 3,740,586 A * 6/1973 Banks ....................... G01F 1/80
                                                        327/31
9,176,636 B1 * 11/2015 Maharyta ................ G06F 3/044
(Continued)

FOREIGN PATENT DOCUMENTS

AT           403213 B      12/1997
DE    102012106526 A1       1/2014
(Continued)

*Primary Examiner* — Alesa Allgood
(74) *Attorney, Agent, or Firm* — Harness, Dickey & Pierce, P.L.C.

(57) ABSTRACT

An evaluation circuit for a capacitive sensor for detecting the distance, speed, or position of an object, comprises a reference capacitance and a measuring capacitance. A square wave voltage is applied to the reference capacitance and the measuring capacitance via a resistor, and a pulse which has a variable duration is obtained with the aid of a logic linking unit. The reference capacitance is connected to a first switching stage and the measuring capacitance is connected to a further switching stage. A single measuring capacitance has a capacitive coupling to an auxiliary electrode, and the switching stages are part of a logic linking unit. An output of the logic linking unit is connected to an integration stage. A charging capacitor (Ca) is charged or discharged via an output of the integration stage.

11 Claims, 4 Drawing Sheets

(51) Int. Cl.
   *G01D 5/24* (2006.01)
   *G01R 27/26* (2006.01)
   *H03K 17/955* (2006.01)

(52) U.S. Cl.
   CPC .............. *H03K 17/962* (2013.01); *H03K 2217/960705* (2013.01); *H03K 2217/960745* (2013.01)

(56) References Cited

U.S. PATENT DOCUMENTS

| | | | |
|---|---|---|---|
| 9,746,507 B1 * | 8/2017 | Bharathan | G01R 1/00 |
| 10,116,307 B2 * | 10/2018 | Maharyta | H03K 17/30 |
| 10,168,187 B2 * | 1/2019 | Schulz | G01R 27/2605 |
| 2008/0252474 A1 * | 10/2008 | Nakamura | H03K 17/955 |
| | | | 340/657 |
| 2010/0059349 A1 * | 3/2010 | Wuestenbecker | H03K 17/962 |
| | | | 200/314 |
| 2015/0365081 A1 * | 12/2015 | Lee | H03K 3/0375 |
| | | | 375/316 |
| 2017/0254674 A1 | 9/2017 | Schulz | |

FOREIGN PATENT DOCUMENTS

| | | | |
|---|---|---|---|
| DE | 102012224007 A1 | 6/2014 |
| DE | 102014216998 A1 | 3/2016 |
| EP | 1860776 A2 | 11/2007 |
| EP | 2568605 A1 | 3/2013 |
| WO | WO-2007025785 A1 | 3/2007 |
| WO | WO-2014012763 A1 | 1/2014 |
| WO | WO-2017046111 A1 | 3/2017 |

\* cited by examiner

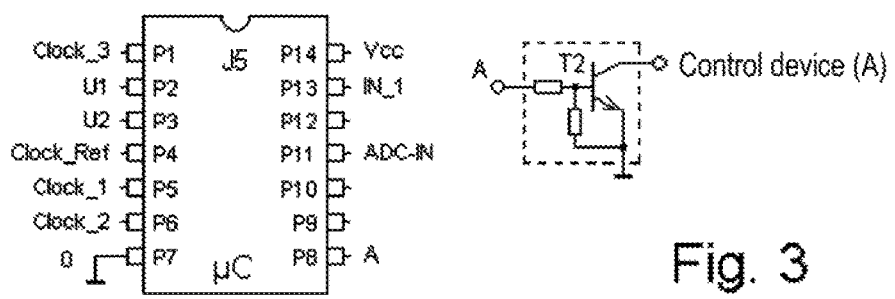
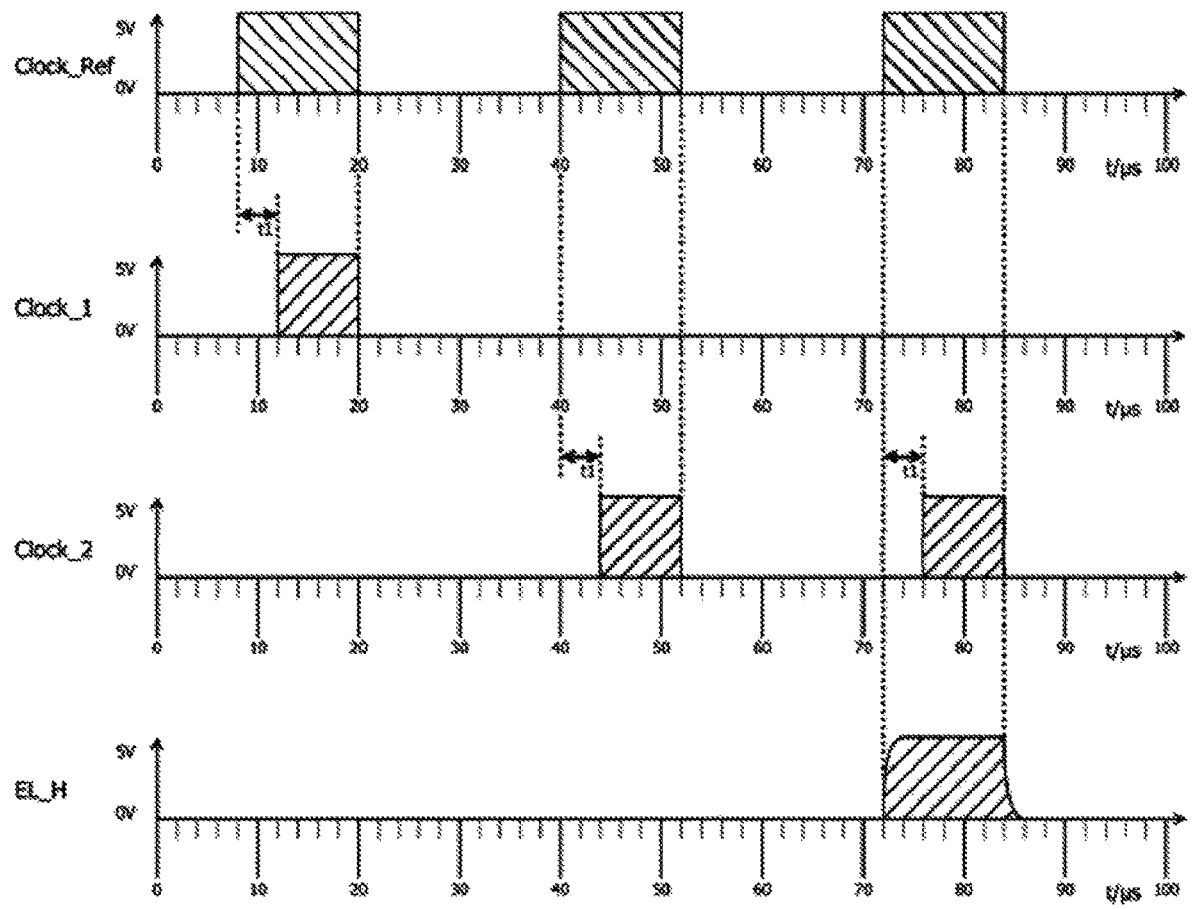
Fig. 3
Fig. 4

EVALUATION CIRCUIT FOR A CAPACITIVE SENSOR, CAPACITIVE SENSOR, AND ACTUATOR IN A MOTOR VEHICLE

CROSS-REFERENCE TO RELATED APPLICATIONS

This application is a National Stage of International Application No. PCT/EP2016/071610, filed on Sep. 14, 2016, and published in German as WO2018/033223 A1 on Feb. 22, 2018. This application claims the priority to German Patent Application No. 10 2016 215 570.9, filed on Aug. 19, 2016. The entire disclosures of the above applications are incorporated herein by reference.

FIELD

The invention relates to an evaluation circuit for a capacitive sensor according to the preamble of claim 1.

Capacitive sensors are widely used not only in the automation technology, but recently also in the automotive technology, where they find application inter alia as a trunk or door opener or for seat occupancy detection.

BACKGROUND

This section provides background information related to the present disclosure which is not necessarily prior art.

AT 403 213 B discloses a capacitive humidity sensor including a square-wave generator whose signal is supplied to an AND gate via two different signal paths, wherein one signal path extends directly and the other includes a measuring electrode whose capacitance influences the signal shape and thereby delays the reaching of a switching threshold.

WO 2007 025 785 A1 discloses a capacitive sensor comprising a square-wave generator whose signal is supplied via two different signal paths to a XOR gate, wherein one signal path includes a measuring electrode and the other a reference electrode.

DE 10 2012 106 526 A1 discloses a capacitive door handle sensor for a motor vehicle comprising at least two electrodes with different monitoring areas, wherein one electrode acts as a reference electrode.

DE 10 2012 224 007 A1 discloses an arrangement and a method for determining the capacitance of a measuring capacitor by means of a voltage detectable with an analog-to-digital converter comprising a charge transfer device for transferring the charge of an unknown capacitance Cx to a measuring capacitor CL, wherein, however, only the comparison of a single unknown capacitance Cx with a reference capacitance Cref is provided.

DE 10 2014 216 998 A1 shows an evaluation circuit for a capacitive sensor comprising a plurality of measuring capacitances and a reference capacitance, wherein the measuring capacitances are successively compared in a predetermined time regime with the same reference capacitance.

SUMMARY

This section provides a general summary of the disclosure, and is not a comprehensive disclosure of its full scope or all of its features.

The object of the invention is to provide a circuit which is further cost-optimized compared to the circuit shown in DE 10 2014 216 998 A1, and which at the same time has additional capabilities for detecting capacitively effective environmental influences.

The object of the invention is achieved with the characterizing features of claim 1. The dependent claims relate to the advantageous embodiment of the invention.

The essential idea of the invention is to compare the measuring capacitance in a predetermined time regime with a reference capacitance and to controllably influence the respective capacitance measurement by means of an additional auxiliary electrode. To this end, the reference capacitance is connected to the input of a first switching stage and the measuring capacitance is connected to the input of a further switching stage, wherein these switching stages are configured, for example, as a NAND gate and form together a logic linking unit which is configured so that the switching time of the first switching stage determines the switch-on time of an output signal and the switching time of another switching stage determines the switch-off time of the output signal or the switching time of the first switching stage determines the switch-off time of an output signal and the switching time of a further switching stage determines the switch-on time of the output signal. The output signals of the logic linking unit are supplied to the input of an integration stage. Via the output of the integration stage, which may also act as a current source, a charging capacitor is charged. The duration of the output pulses generated by the abovementioned logic linking unit determines the voltage of the charging capacitor.

In an advantageous embodiment, the reference capacitance or the measuring capacitance is connected to a time influencing unit which comprises a capacitor and a voltage source or is connected to a controllable voltage source. The time influencing unit is used for targeted influencing the delay time generated by the reference capacity or the measuring capacity.

The advantage of the invention is that by means of an auxiliary electrode which is applied with a voltage signal substantially simultaneously with a measuring electrode, a targeted capacitive influence of the measuring electrode is possible, so that in this way further spatial regions in the vicinity of the measuring electrode can be evaluated capacitively without requiring a separate measuring channel with additional circuit complexity for the capacitance measurement of an electrode.

Thus, for example, with only one IC of the type 74HC132 a capacitive sensor with a plurality of spatially distinguishable areas can be constructed, which leads on the one hand to a saving of components and on the other hand offers additional capabilities for the detection of capacitively effective environmental influences.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

The invention will be explained in more detail with reference to the drawings.

FIG. 3 shows a microcontroller including a switching stage associated to the circuits in FIGS. 1 and 2;

FIG. 4 shows the timing diagram for controlling the measurement in detail;

Figure 6:
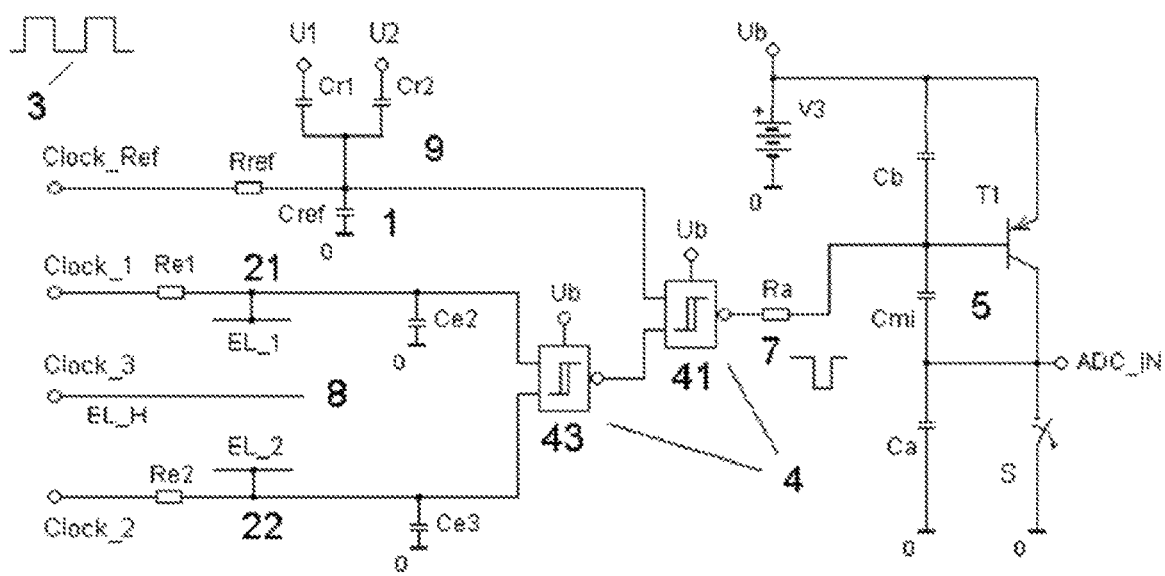
Figure 7:
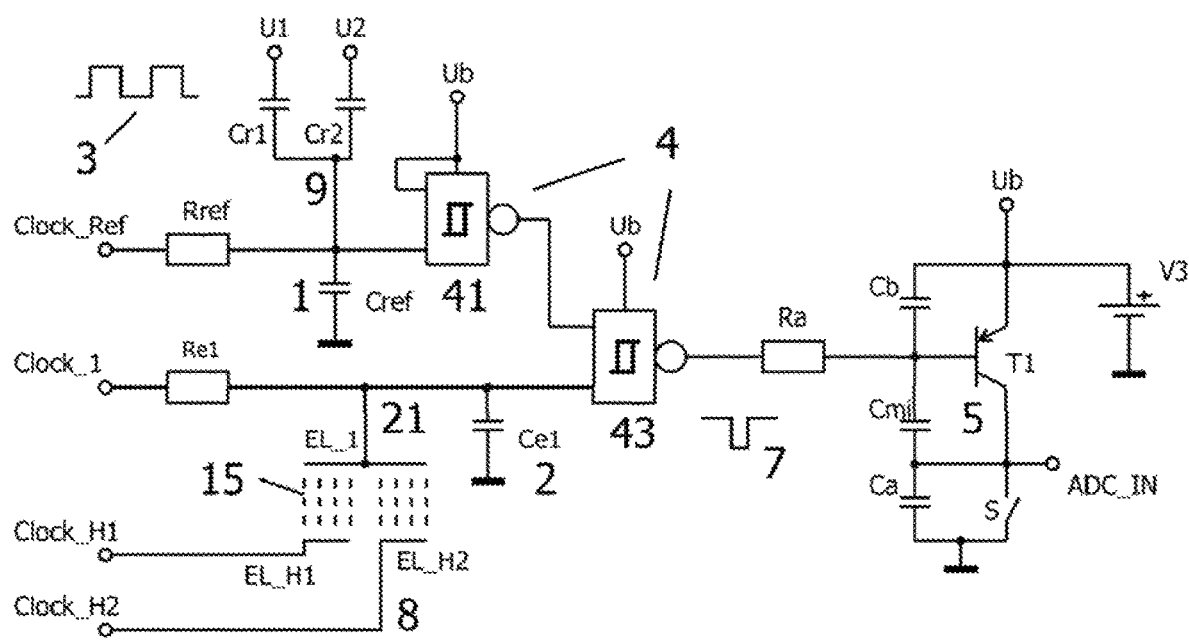

FIG. 6 describes an example with two sensor electrodes and an active auxiliary electrode; and FIG. 7 describes an example with one sensor electrode and two auxiliary electrodes.

Corresponding reference numerals indicate corresponding parts throughout the several views of the drawings.

DETAILED DESCRIPTION

Example embodiments will now be described more fully with reference to the accompanying drawings.

Figure 1:
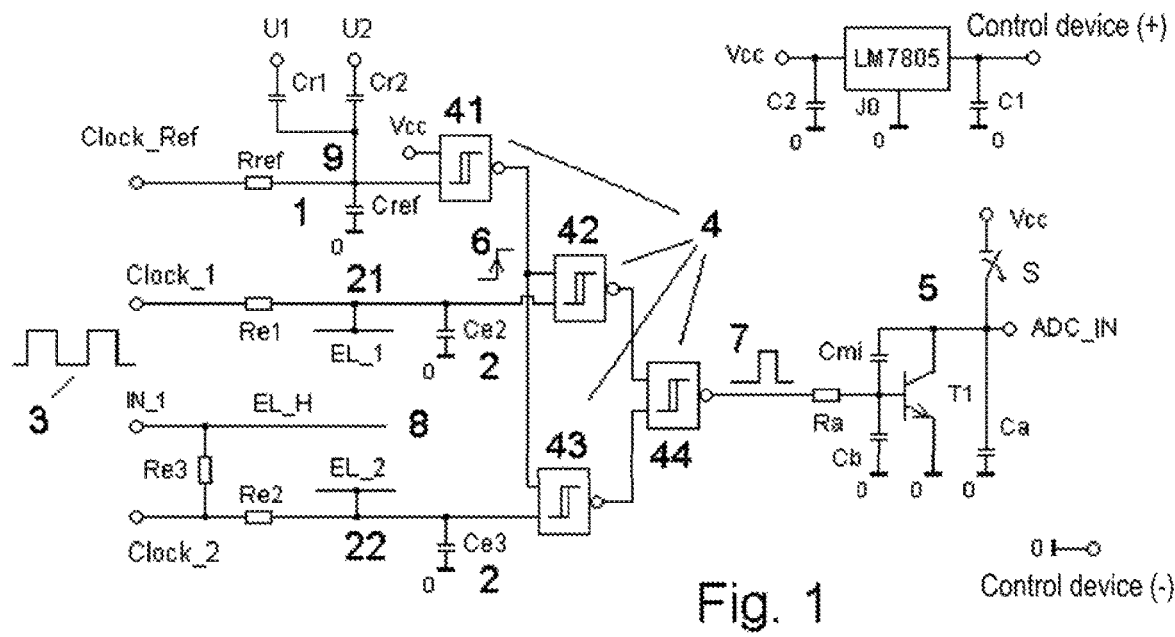
FIG. 1 shows an evaluation circuit according to the invention comprising a passive auxiliary electrode.

FIG. 1 shows an exemplary embodiment with an integrated circuit of the type 74HC132 comprising four switching stages (NAND gate) 41, 42, 43, 44 forming a logic linking unit 4, wherein in the idle state the controllable gate input of the switching stage designated by 41 is at the logic state "high", so that its output and thus the control signal 6 assumes the logic state "low". This has the consequence that for the duration of this state, the switching stages 42, 43 are also at "low" at their input which is not externally controllable and thus are signal technically locked, so that their outputs are at "high" for the duration of this signal state, the switching stage 44 assumes the state "low" at its output and the integration stage 5 is also locked, wherein the charging capacitor designated by Ca remains charged, which was previously charged via the switch S, which in turn is controlled by the microcontroller µC shown in FIG. 3.

The control input of the switching stage 41 which is not connected to the operating voltage is connected to a time influencing unit 9, which in addition to $R_{ref}$ and $C_{ref}$ comprises two capacitors $C_{r1}$ and $C_{r2}$, which are connected to the auxiliary voltage sources $U_1$ and $U_2$.

In the idle state, the clock input Clock_Ref and one of the clock inputs Clock_1, Clock_2 are at "high." In this example it is assumed that the clock input Clock_1 is currently set at "high". The respective other clock input is at "low". In this example, the switching stage 42, whose clock input is at "high", is prepared for a pulse generation while the other clock input, in this example the switching stage 43, remains locked by the logical input signal "low".

In order to generate a pulse at one of the outputs of the switching stages 42, 43, and thus also at 44, both the clock input "Clock_Ref" and the clock input set at "high" of the clock inputs Clock_1, Clock_2 are simultaneously switched to "low" by means of an externally connected control unit J5 shown in FIG. 3 such as a microcontroller (µC). As a result, the signal applied at "Clock_Ref" passes through the low pass Rref, Cref to the input of the switching stage 41 and triggers at its output a positive voltage jump upon reaching the threshold voltage, wherein the delay time of this voltage jump is influenced by the time influencing unit 9, by means of which the signal at Cref can be shifted in time. For this purpose, the auxiliary voltages U1 and U2 are applied. These voltages and also the three clock signals shown in FIG. 4 (Clock_Ref, Clock_1, Clock_2) may be generated by the previously described control unit (µC).

For a meaningful pulse generation, all time constants and all control signals, which signal technically are located upstream of the gate inputs of the gates 41 and 42, 43, are dimensioned or adjusted so that at first the voltage at the gate input of gate 41 reaches the negative switching threshold. This causes the logic state of gates 42, 43 which are not externally accessible to change from "low" to "high" so that, as shown, gate 42, at which input which is not externally accessible the logic state "high" is applied, switches its output to "low" and thus drives the downstream connected integration stage 5 via the downstream connected logic element (NAND gate) 44. Thus, a discharge process of the capacitor designated with Ca is started via the integration stage 5. The switch-on time of this output signal is thus determined by the switching time of the first switching stage 41. The other gate 43, at which the externally accessible input is set to "low" from the onset, thus remains signal technically locked.

Thereafter, the voltage at the externally accessible gate input, whose connected clock input is switched from "high" to "low" simultaneously with the signal "Clock_Ref" reaches its negative switching threshold, so that the gate output of the switching stage 42 which has just switched from "high" to "low" switches back to "high" and the gate 44 switches back to "low" and thus interrupts again the driving of the downstream connected integration stage 5, whereby the discharge process of the capacitor designated with Ca is terminated. Thus, the switch-off time of this output signal is determined by the switching time of the further switching stage 42.

Thus, upon reaching the threshold voltage of a first switching stage 41 a start signal and upon reaching the threshold voltage of another switching stage 42 or 43 a stop signal is generated.

For selectively influencing the delay time generated by the reference capacitance 1 ($C_{ref}$) the time influencing unit 9 includes a capacitor $C_{r1}$ and a voltage source $U_1$ controllable by the evaluation unit (µC).

Thus, the time duration with which the integration stage 5 is driven depends on the electrode capacitance to be measured, which is associated to the respective activated clock input (Clock_1, Clock_2). For evaluating any capacitance to be measured, the respective associated clock input is driven in the manner described above.

Here, the auxiliary electrode 8 designated with EL_H is provided at a further terminal IN_1 of the control unit µC of FIG. 3, is fed by a resistor (Re3) from one of the clock inputs Clock_1, Clock_2, and is capacitively coupled to one of the measuring electrodes 21, 22 (EL_1, EL_2). In the example shown, the auxiliary electrode 8 is fed by the clock input Clock_2 and is capacitively coupled to the measuring electrode 22 (EL_2).

During the pulse generation of Clock_2 the terminal IN_1 can be operated in 2 different modes, such as in a high impedance and in a low impedance mode. As a result, in the high impedance mode, the clock signal applied at Clock_2 is likewise supplied to the auxiliary electrode 8 (EL_H), while in the low impedance mode the clock signal provided at Clock_2 is short-circuited by IN_1 and thus does not appear at the auxiliary electrode 8 (EL_H). Thus, in the two different modes the capacitance measurement at 22 (EL_2) is influenced differently via the capacitive coupling between the electrodes 8 (EL_H) and 22 (EL_2), which in the signal evaluation enables the provision of information about the mutual capacitance between the electrodes 8 (EL_H) and 22 (EL_2).

This can be useful, for example, to be able to detect the influence of objects located outside the sensor arrangement, such as water, conductive primer or a chromium coating on the housing of the device and thus to be able to optimize the detection characteristic of the sensor, for example by means of adapted parameterization. In this way, unwanted operating conditions can be suppressed or the influence of variable mounting environments can be detected.

Figure 2:
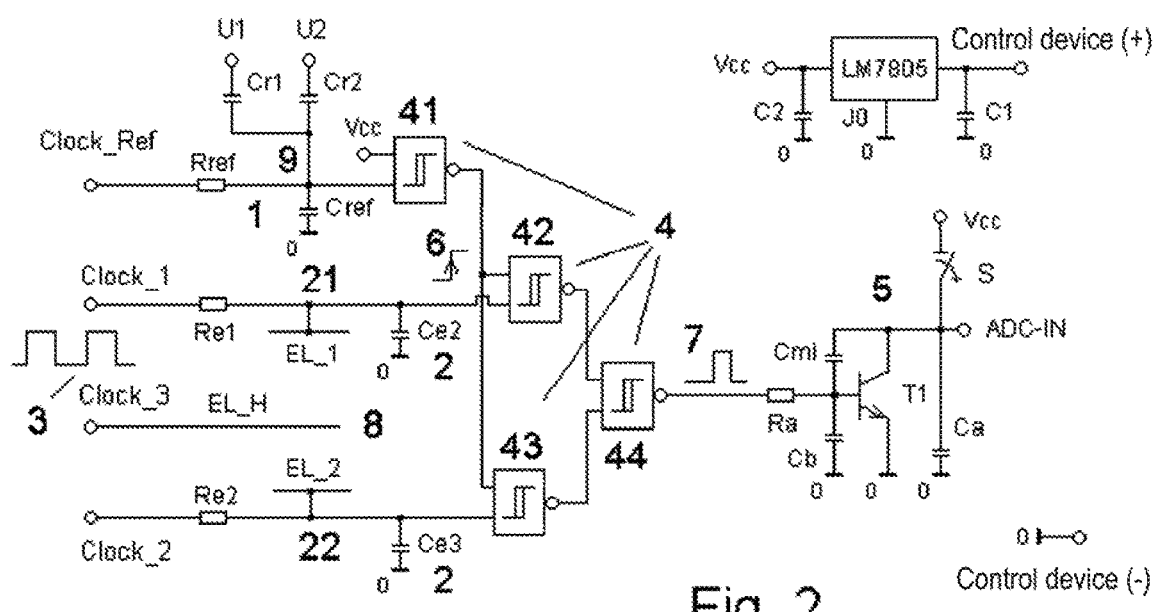
FIG. 2 shows an evaluation circuit according to the invention comprising an active auxiliary electrode.

FIG. 2 shows a circuit arrangement similar to that of FIG. 1, which differs only by the driving of the auxiliary electrode 8 (EL_H). In this exemplary embodiment the auxiliary electrode 8 (EL_H) is fed by an additional clock input Clock_3. The exemplary embodiment of FIG. 2 offers the additional possibility to be able to temporally assign the control signal at Clock_3 both to the measurement at 21 (EL_1) and the measurement at 22 (EL_2) and thus to evaluate both mutual capacitances. If Clock_3 is generated simultaneously with Clock_1 the capacitance between the electrodes 8 (EL_H) and 21 (EL_1) is influenced. If, on the other hand, Clock_3 is generated simultaneously with Clock_2 the capacitance between the electrodes 8 (EL_H) and 22 (EL_2) is influenced. In addition, the control signal for Clock_3 can be generated both in-phase and in opposite phase, which allows the double useful signal hub. This exemplary embodiment requires a further terminal of the microcontroller μC, which enables this operating mode. Depending on the type of the microcontroller μC (J5 in FIG. 3), the variant of FIG. 1 or the variant of FIG. 2 may be preferred.

FIG. 3 shows a microcontroller for controlling and evaluating the circuits indicated in the two preceding figures. For FIG. 1, the terminal P1 (Clock_1) is not required and can remain free. The same applies to FIG. 2 and terminal P13 (IN_I). Terminal P8 (A) is connected to a switching stage (T2) which can transmit, for example, a switching signal or a bus signal in order to transmit the desired measurement results or evaluation criteria by use of the switching stage T2 to an external control device.

FIG. 4 shows an exemplary associated pulse diagram in detail. The signals correspond to the clocks of FIG. 1. The clock signal intended for gate 41 (Clock_Ref), the clock signal (Clock_1) intended for gate 42, the clock signal (Clock_2) intended for gate 43 and the signal voltage applied to the auxiliary electrode 8 (EL_H) can be seen. This signal voltage is evaluated in the illustrated signal pattern in cooperation with the clock signal (Clock_2) which drives the electrode 22 (EL_2). Two different modes are shown, wherein in one mode the clock signal Clock_Ref is generated simultaneously with the clock signal Clock_2. In the diagram this is the time 52 μs. In the other mode, which at the time 84 μs generates another clock signal, an additional signal edge can be seen at EL_H, by means of which an influence of the mutual capacitance between EL_2 and EL_H is achieved. The time duration designated with "t1" serves to establish a defined initial state and must be at least as large as the sum of all delay times that may influence the electrical potential of the relevant capacitances, and thus ensures a reproducible measuring procedure.

Figure 5:
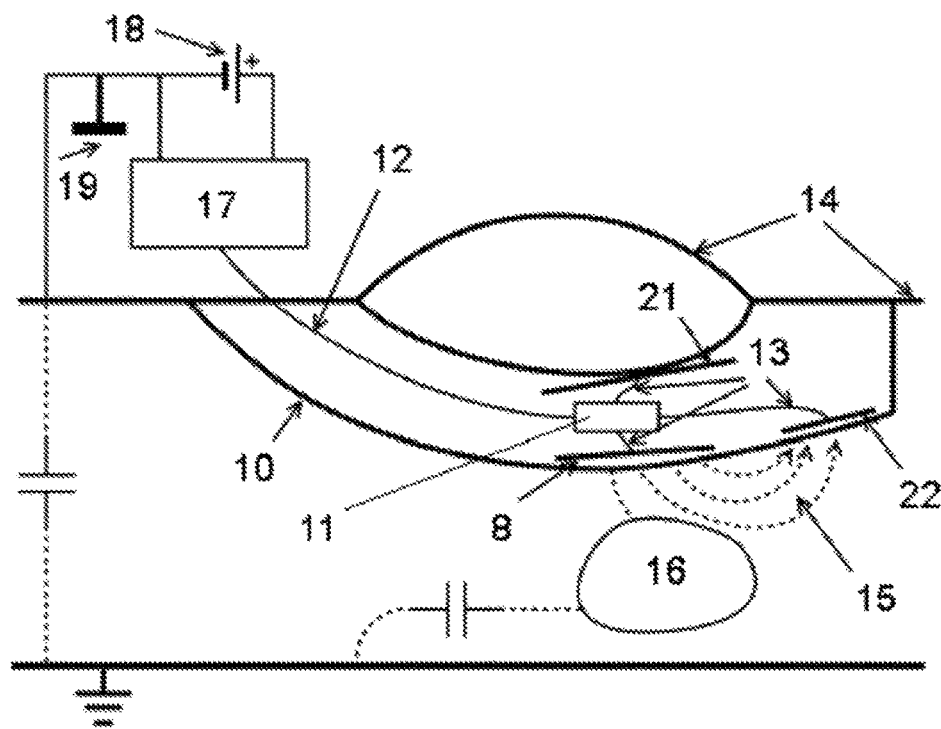
FIG. 5 shows the configuration of the circuit according to the invention in a vehicle door handle.

FIG. 5 shows a constructive exemplary embodiment in the door handle of a motor vehicle, wherein the operating principle of the auxiliary electrode 8 and the influence of the mutual capacitive coupling (electric field 15) between the auxiliary electrode 8 and the electrode 22 is shown, which is influenced by an approached influencing object 16. The constructive sensor arrangement here includes the electronics 11 including an electrode system 8, 13, 22, a housing 10 and other construction-related elements which also influence the mutual capacitive coupling between the auxiliary electrode and another electrode. However, the arrangement is only sensory usable, i.e. in the sense of detecting certain operating conditions or influencing factors such as water or unwanted operating conditions, if at least a part of the capacitive coupling 15 extends outside of this constructive sensor arrangement, so that it can be influenced by external objects 16.

FIG. 6 describes a particularly simple battery operated exemplary embodiment, in which the logic linking unit 4 consists of only two NAND gates 41, 43. At the input of the first switching stage 43 the electrodes 21, 22 are connected. Here, the function of the further switching stage, at whose input the reference capacitance 1 is provided, is taken over by gate 41. The circuit includes two sensor electrodes 21, 22 and one auxiliary electrode 8, which is actively applied with an auxiliary signal (Clock_3). In this arrangement, therefore, the switch-on time of the output signal 7 of the logic linking unit 4 is determined by the switching points of the switching stage 43 to which the measuring capacitance is connected. The switch-off time of the output signal 7 of the logic linking unit 4 is determined by the switching point of the switching stage 41, at which the reference capacitance is connected. In this exemplary embodiment the charging capacitor Ca at the output of the integration device 5 is loaded.

FIG. 7 shows a power-saving exemplary embodiment for battery operated applications, wherein the logic linking unit 4 consists of only two NAND gates 41, 43, and a NAND gate can be further simplified and optionally also be implemented as an inverter. Here only a single measuring capacitance 2 is present. Nevertheless, several positions can be spatially evaluated, depending on which of the two auxiliary electrodes 8 is actively supplied with an auxiliary signal (Clock_H1, Clock_H2). In addition, even a plurality of auxiliary electrodes can simultaneously be actively supplied with an auxiliary signal (Clock_H1, Clock_H2) in order to obtain additional information by the functional modes thus generated, for example for more precise differentiation of specific operating conditions or influencing factors such as e.g. water or pollution. At the input of the first switching stage 43 the electrode 21 is connected. Here, the function of the further switching stage, at whose input the reference capacitance 1 is provided, is taken over by gate 41. The circuit includes a sensor electrode 21 and two auxiliary electrodes (8, EL_H1, EL_H2) which are actively supplied with an auxiliary signal (Clock_H1, Clock_H2).

In this arrangement, the switch-on time of the output signal 7 of the logic linking unit 4 is determined by the switching point of the switching stage 43, to which the measuring capacitance is connected. The switch-off time of the output signal 7 of the logic linking unit 4 is determined by the switching point of the switching stage 41, to which the reference capacitance is connected. In this exemplary embodiment the charging capacitor Ca at the output of integration device 5 is loaded.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. An evaluation circuit for a capacitive sensor for detecting a distance, a velocity or a position of an object, comprising a reference capacitance and a measuring capacitance, wherein the reference capacitance and the measuring capacitance are supplied with a square wave voltage via a resistor, and wherein by means of a logic linking unit a time-variable pulse is obtained whose duration is a measure of the measuring capacity, wherein the reference capacitance is connected to the input of a first switching stage and the measuring capacitance is connected to the input of a further switching stage, wherein a single measuring electrode has a capacitive coupling with at least one auxiliary electrode, wherein the switching stages are part of the logic linking unit, which is configured such that the achievement of a threshold voltage of the first switching stage determines the switch-on time of an output signal, and the achievement of a threshold voltage of the further switching stage determines the switch-off time of the output signal, and wherein the output of the logic linking unit is connected to the input of an integration stage, wherein a charging capacitor (Ca) is charged or discharged via the output of the integration stage, wherein the capacitive coupling between the at least one auxiliary electrode and the measuring electrode is influencable by objects, which are disposed structurally outside a sensor arrangement, wherein several positions of the objects can be spatially evaluated by means of the single measuring electrode.

2. The evaluation circuit according to claim 1, wherein the measuring capacitance is connected to a time-influencing unit, wherein the time-influencing unit comprises a capacitor and a controllable voltage source and is used for targeted influencing the delay time generated by the measuring capacitance.

3. A capacitive sensor comprising an evaluation circuit according to claim 1.

4. The evaluation circuit according to claim 1, wherein the reference capacitance is connected to a time influencing unit, wherein the time influencing unit comprises a capacitor ($C_{r1}$, $C_{r2}$) and a controllable voltage source (U1, U2) and is used for targeted influencing the delay time generated by the reference capacity.

5. A capacitive sensor comprising an evaluation circuit according to claim 4.

6. A capacitive sensor comprising an evaluation circuit according to claim 1.

7. An actuator in a motor vehicle comprising a capacitive sensor according to claim 6.

8. The evaluation circuit according to claim 1, wherein the reference capacitance is connected to a time influencing unit, wherein the time influencing unit comprises a capacitor ($C_{r1}$, $C_{r2}$) and a controllable voltage source (U1, U2) and is used for targeted influencing the delay time generated by the reference capacity.

9. A capacitive sensor comprising an evaluation circuit according to claim 8.

10. The evaluation circuit according to claim 1, wherein the measuring capacitance is connected to a time-influencing unit, wherein the time-influencing unit comprises a capacitor and a controllable voltage source and is used for targeted influencing the delay time generated by the measuring capacitance.

11. An actuator in a motor vehicle comprising a capacitive sensor according to claim 10.

* * * * *